United States Patent [19]
Lee et al.

[11] Patent Number: 5,912,856
[45] Date of Patent: Jun. 15, 1999

[54] INTERNAL VOLTAGE GENERATING CIRCUIT IN SEMICONDUCTOR MEMORY DEVICE

[75] Inventors: Ho-Jae Lee, Ich'on; Kyoung-shub Lee, Wonju-shi; Huy-Cheol Bae, Ich'on, all of Rep. of Korea

[73] Assignee: Hyundai Electronics Industries Co., Ltd., Ich'on, Rep. of Korea

[21] Appl. No.: 08/998,449

[22] Filed: Dec. 26, 1997

[30] Foreign Application Priority Data

Dec. 30, 1996 [KR] Rep. of Korea .................. 96-77795

[51] Int. Cl.⁶ .................................................. G11C 7/00
[52] U.S. Cl. ........................... 365/226; 365/201; 365/210
[58] Field of Search .................................. 365/226, 201, 365/210; 327/534, 535, 536, 540

[56] References Cited

U.S. PATENT DOCUMENTS

| | | | |
|---|---|---|---|
| 5,300,824 | 4/1994 | Iyengar | 307/296.3 |
| 5,396,113 | 3/1995 | Park et al. | 327/543 |
| 5,636,171 | 6/1997 | Yoo et al. | 365/226 |
| 5,666,313 | 9/1997 | Ichiguchi | 365/226 |
| 5,694,364 | 12/1997 | Morishita et al. | 365/226 |

*Primary Examiner*—Son T. Dinh
*Attorney, Agent, or Firm*—Ware, Fressola, Van Der Sluys & Adolphson LLP

[57] ABSTRACT

An internal voltage generator circuit in a semiconductor memory device includes high voltage detecting means for receiving an external voltage, detecting whether the external voltage is at a high voltage in a burn-in mode, and generating a detection signal; and internal voltage generating means driven by a driving signal externally applied, for generating an internal voltage for a burn-in mode of a desired high voltage level higher than the external voltage or an internal voltage lower than the external voltage in response to the detection signal received from the high voltage detecting means.

19 Claims, 4 Drawing Sheets

INTERNAL VOLTAGE GENERATING CIRCUIT IN SEMICONDUCTOR MEMORY DEVICE

BACKGROUND OF THE INVENTION

1. Field of the Invention

The present invention relates to an internal voltage generating circuit in a semiconductor memory device and, more particularly, to an internal voltage generating circuit in a semiconductor memory device using an internal power supply which generates an internal voltage of a high voltage level to a word line in a burn-in mode.

2. Discussion of Related Art

In general, a semiconductor memory device converts a power supply voltage Vext which is externally applied, to an internal power supply voltage Vint lower than the external voltage Vext through an internal voltage generating circuit for the use as a power.

Figure 6:
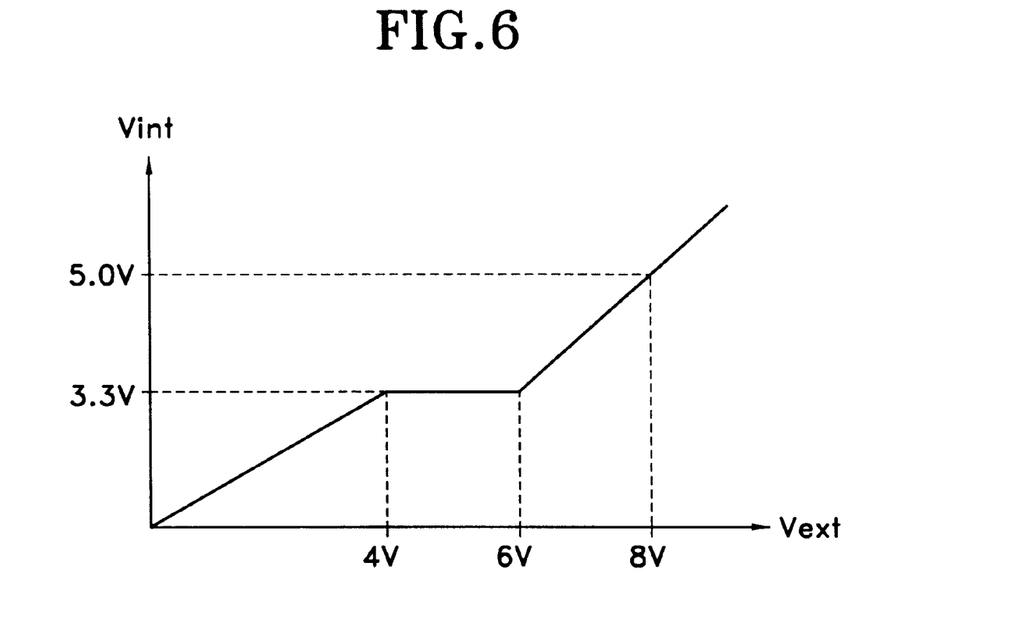
FIG. 6 is an output waveform diagram of an internal voltage generating circuit in a semiconductor memory device according to prior art.

As shown in FIG. 6, when an external voltage Vext of 4.0–6.0 volts is applied, an internal voltage Vint of 3.3 V is applied to the internal circuit of a semiconductor memory device. On the other hand, the internal circuit uses an internal voltage Vint of 5.0 volts, when an external voltage Vext of 8.0 volts is applied to.

In such a semiconductor memory device which receives the external voltage Vext externally applied and generates an internal voltage Vint lower than the external voltage Vext to an internal circuit through an internal voltage generating circuit, although the external voltage Vext of 8.0 volts is applied to in a burn-in mode, the internal voltage generating circuit receives the external voltage Vext of 8.0 volts and generates the internal voltage Vint of 5.0 volts to a word line W/L.

Thus, the internal voltage Vint applied to the word line W/L is lower than the external voltage Vext by about 3 volts in a burn-in mode so that a word line driving capacity will be deteriorated with a decreased stress effect.

SUMMARY OF THE INVENTION

Accordingly, the present invention is directed to an internal voltage generating circuit in a semiconductor memory device that substantially obviates one or more problems due to limitations and disadvantages of the related art. An object of the present invention is to provide an internal voltage generating circuit in a semiconductor memory device which generates an internal voltage of a high voltage level for driving a word line when high voltage above a selected voltage level is applied as an external voltage in a burn-in mode, thus enhancing the word line driving efficiency.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an internal voltage generating circuit in a semiconductor memory device includes: high voltage detecting means for receiving an external voltage, detecting whether the external voltage is at a high voltage in a burn-in mode, and generating a detection signal; and internal voltage generating means driven by a driving signal externally applied, for generating an internal voltage lower than the external voltage or an internal voltage for a burn-in mode of a desired high voltage level higher than the external voltage in response to the detection signal received from the high voltage detecting means.

In the internal voltage generating circuit of a semiconductor memory device according to the present invention, the high voltage detecting means includes: voltage dividing means for voltage-dividing the external voltage; comparing means for comparing the divide voltage of the voltage dividing means to a reference voltage; and detection signal generating means for generating the detection signal according to an output signal from the comparing means.

In the internal voltage generating circuit of a semiconductor memory device according to the present invention, the voltage dividing means of the voltage detecting means includes: a first NMOS transistor serving as a current source, which the reference voltage is applied to its gate, and its source is grounded; and first to third PMOS transistors serving as resistor means, which are connected in series between a drain of the first NMOS transistor and the external voltage and their gates are commonly connected to the drain of the first NMOS transistor, wherein the divided voltage from the voltage dividing means is generated through the drains of the third PMOS transistor and the first NMOS transistor commonly connected each other.

In the internal voltage generating circuit of a semiconductor memory device according to the present invention, the comparing means of the high voltage detecting means includes: fourth and fifth PMOS transistors, serving as a current mirror, which their sources receive the external voltage and their gates are commonly connected to a drain of the fifth PMOS transistor; second NMOS transistor which the divided voltage from the voltage dividing means is applied to its gate, and its drain is connected to a drain of the fourth PMOS transistor; third NMOS transistor which the reference voltage is applied to its gate and its drain is connected to the drain of the fifth PMOS transistor; and a fourth NMOS transistor which the reference voltage is applied to its gate, its drain is connected to sources of the second and third NMOS transistors, and its source is grounded, wherein the output signal from the comparing means is generated through the drains of the fourth PMOS transistor and the second NMOS transistor commonly connected each other.

In the internal voltage generating circuit of a semiconductor memory device according to the present invention, the detection signal generating means of the high voltage detecting means includes: a sixth PMOS transistor which the external voltage is applied to its source, and the output signal of the comparing means is applied to its gate; and a fifth NMOS transistor which its drain is connected to a drain of the sixth PMOS transistor, its source is grounded, and the reference voltage is applied to its gate, wherein the detecting signal from the detecting generating means is generated through the drains of the sixth PMOS transistor and the fifth NMOS transistor commonly connected each other.

In the internal voltage generating circuit of a semiconductor memory device according to the present invention, the high voltage detecting means further comprises buffer means for providing the detection signal of the detection signal generating means to the internal voltage generating means. The buffer means includes a plurality of inverters for providing the detection signal of the detection signal generating means to the internal voltage generating means.

In the internal voltage generating circuit of a semiconductor memory device according to the present invention, the internal voltage generating means includes: determining means in response to the driving signal, for determining whether high voltage is detected according to the detection signal from the high voltage detection means and generating a determining signal; first generating means for generating the internal voltage for a burn-in mode of a desired high voltage level higher than the external voltage in accordance with the determining signal from the determining means; second generating means for generating the internal voltage lower than the external voltage in accordance with a control signal; and controlling means in response to the driving signal, for generating the control signal for controlling the second generating means.

In the internal voltage generating circuit of a semiconductor memory device according to the present invention, the determining means of the internal voltage generating means includes: a NAND gate for receiving the driving signal and the detection signal from the high voltage detecting section; and an inverter for inverting an output signal of the NAND gate and providing the inverted output of the NAND gate as the determining signal to the first generating means.

In the internal voltage generating circuit of a semiconductor memory device according to the present invention, the first generating means of the internal voltage generating means includes: a first NMOS transistor which the determining signal from the determining means is applied to its gate, and its source is grounded; and a first PMOS transistor which the external voltage is applied to its source, its gate is connected to a drain of the first NMOS transistor and generates the internal voltage for a burn-in mode through its drain.

In the internal voltage generator circuit of a semiconductor memory device according to the present invention, the controlling means of the internal voltage generating means includes: a second PMOS transistor which the driving signal is applied to its gate, the external voltage is applied to its source, and the first generating means is connected to its drain; third and fourth PMOS transistors, serving as a current mirror, which the external voltage is applied to their source, and their gates are commonly connected to a drain of the fourth PMOS transistor; a second NMOS transistor which a drain of the third PMOS transistor is connected to its drain, and the reference voltage is applied to its gate; a third NMOS transistor which the drain of the fourth PMOS transistor is connected to its drain, and the internal voltage from the first generating means is applied to its gate; and a fourth NMOS transistor which sources of the second and third NMOS transistors are connected to its drain, the driving signal is applied to its gate and its source is grounded, wherein the control signal from the controlling means is generated through the drains of the third PMOS transistor and the second NMOS transistor commonly connected each other.

In the internal voltage generating circuit of a semiconductor memory device according to the present invention, when the external voltage is above 7 volts, the high voltage detecting means generates the detection signal of a high state by determining as the burn-in mode. The internal voltage generating means produces a desired high voltage of 8 volts as the internal voltage in a burn-in mode.

The present invention is characterized by an internal voltage generating circuit of a semiconductor memory device including: high voltage detecting means for detecting whether an external voltage is at a high voltage in a burn-in mode and generating a detection signal; and internal voltage generating means including determining means in response to the driving signal, for determining whether high voltage is detected according to the detection signal from the high voltage detection means; first generating means for generating the internal voltage for a burn-in mode of a desired high voltage level higher than the external voltage; second generating means for generating the internal voltage lower than the external voltage in accordance with a control signal; and controlling means in response to the driving signal, for generating the control signal for controlling the second generating means, wherein when the high voltage detection means detects the high voltage, the determining means of the internal voltage generating means generates the determining signal of a high state and the first generating means of the internal voltage generating means is enabled according to the determining signal of a high state, and thereby generating the internal voltage for a burn-in mode higher than the external voltage, otherwise the controlling means generates the control signal of a low state and the second generating means is enabled, thereby generating the internal voltage lower than the external voltage.

The present invention is characterized by an internal voltage generating circuit in a semiconductor memory device including: high voltage detecting means for dividing an external voltage, comparing the divided voltage to a reference voltage, and generating a detection signal according to the result of the comparison; and internal voltage generating means driven by a driving signal externally applied, for determining whether the high voltage is detected from the high voltage detection means, and generating an internal voltage for a burn-in mode higher than the external voltage or an internal voltage lower than the external voltage in accordance with the determining result.

The internal voltage generating circuit in a semiconductor memory device of the present invention detects whether an external voltage is at a predetermined high voltage level, and generates an high internal voltage higher than the external voltage when it recognizes as a burn-in mode according to the detecting result, otherwise it generates an internal voltage lower than the external voltage. Thus, the present invention increases the stress of the word line in a burn-in mode and enhances the word line driving efficiency.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENT

Reference will now be made in detail to the preferred embodiments of the present invention, examples of which are illustrated in the accompanying drawings.

Figure 1:
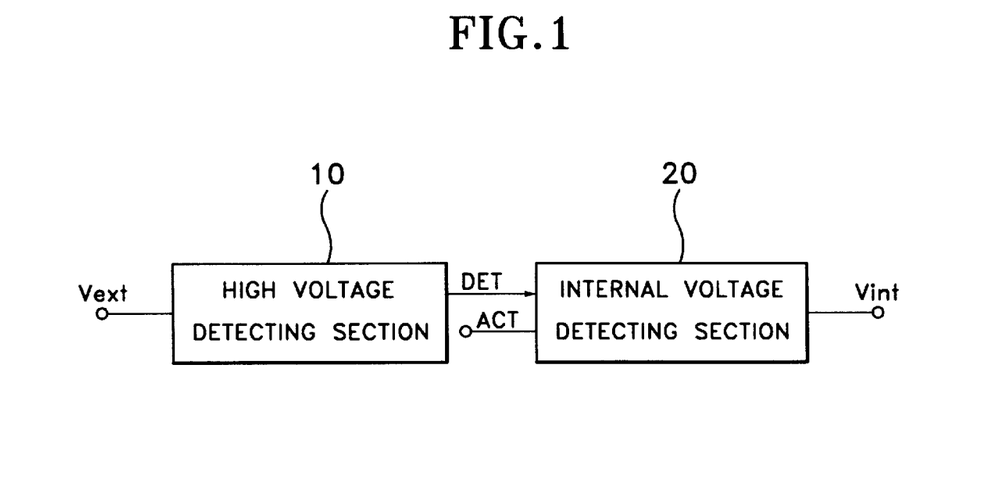
FIG. 1 is a block diagram of an internal voltage generating circuit in a semiconductor memory device according to the preferred embodiment of the present invention.

FIG. 1 is a block diagram of an internal voltage generating circuit in a semiconductor memory device according to the preferred embodiment of the present invention.

Referring to FIG. 1, the semiconductor memory device includes a high voltage detecting section 10 for receiving an external voltage Vext, and an internal voltage generating section 20 for generating an internal voltage Vint in response to a detection signal DET generated from the high voltage detecting section 10.

The high voltage detecting section 10 receives the external voltage Vext, detects whether the external voltage Vext applied is at a high voltage in a burn-in mode, and provide an output signal DET according to the detecting result to the internal voltage generating section 20.

Figure 2:
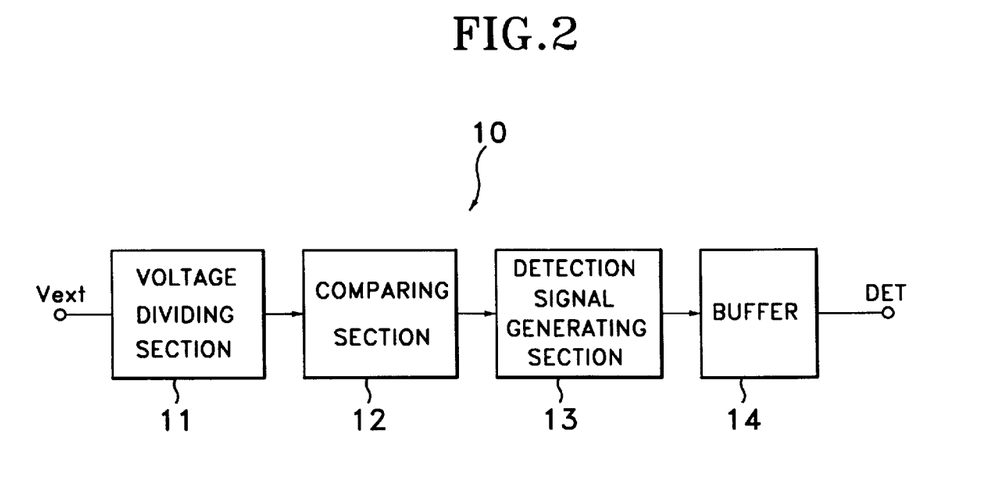
FIG. 2 is a block diagram of a high voltage detecting section shown in FIG. 1.

As shown in FIG. 2, the high voltage detecting section 10 includes a voltage dividing section 11 for dividing the external voltage Vext, a comparing section 12 for comparing the divided voltage of the voltage dividing section 11 to the reference voltage VR, a detection signal generating section 13 for receiving an output signal of the comparing section 12 and generating an output signal DET as a detection signal, and a buffer 14 for applying the detection signal DET of the detection signal generating section 13 to the internal voltage generating section 20.

Figure 3:
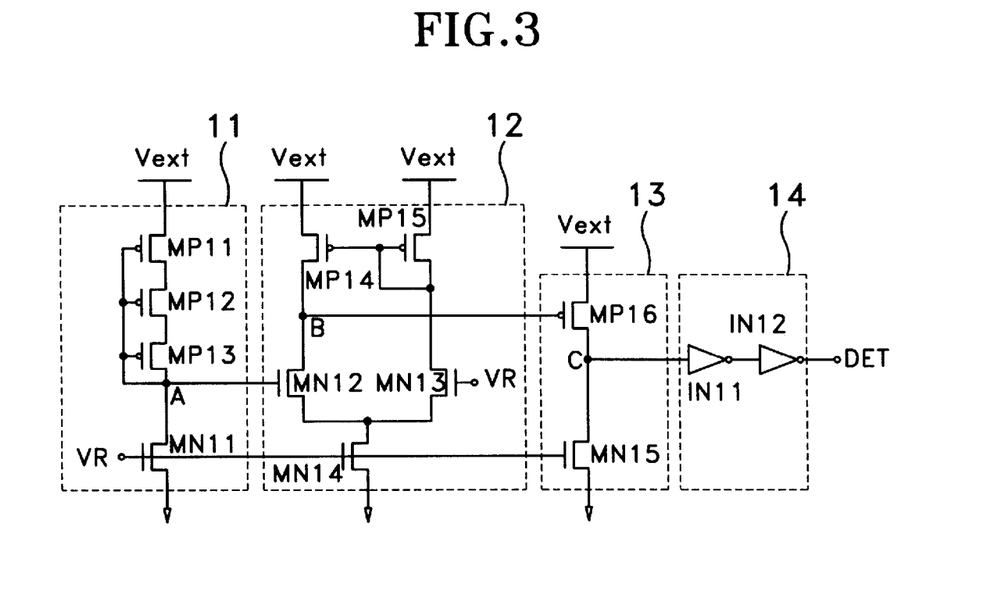
FIG. 3 is a detail circuit diagram of the high voltage detecting section shown in FIG. 2.

Referring to FIG. 3, the voltage dividing section 11 in the high voltage detecting section 10 includes an NMOS transistor MN11, serving as a current source, which the reference voltage VR is applied to its gate, its source is grounded, and a plurality of PMOS transistors MP11–MP13, serving as resistors which are connected in series between the external voltage Vext and a drain of the NMOS transistor MN11, their gates are commonly connected to a drain of the NMOS transistor MN11. The voltage dividing section 11 generates a divided voltage through a node A, i.e., the drains of the PMOS transistor MP13 and NOS transistor MN11 commonly connected each other.

The comparing section 12 in the voltage detecting section 10 comprises PMOS transistors MP14 and MP15, serving as a current mirror, which the external voltage Vext is applied to their sources and their gates are commonly connected to a drain of the PMOS transistor MP15, NMOS transistor MN12 and MN13, serving as a comparing means, which the divided voltage of the voltage dividing section 11 and the reference voltage VR are respectively applied to their gates and drains of the PMOS transistors MP14 and MP15 are respectively connected to their drains, and an NMOS transistor MN14, serving as a current source, which the reference voltage VR is applied to its gate, sources of the NMOS transistors MN12 and MN13 are connected to its drain and its source is grounded. The comparing section generates an output signal according to the comparing result through a node B, i.e., the drains of the PMOS transistor MP14 and NMOS transistor MN12 commonly connected each other.

The detection signal generating section 13 in the high voltage detecting section 10 comprises a PMOS transistor MP16 which the external voltage Vext is applied to its source and the output signal of the comparing means is applied to its gate and an NMOS transistor MN15 which a drain of the PMOS transistor MP16 is connected to its drain and its source is grounded and the reference voltage VR is applied to its gate.

In case where the external voltage Vext is detected as a high voltage in a burn-in mode, the detection signal generation section 13 outputs the detection signal of a high state through a node C, i.e., the drains of the NMOS transistor MN15 and PMOS transistor MP16 commonly connected each other.

The buffer 14 in the high voltage detecting section 10 comprises a plurality of inverters IN11 and IN12 for providing the detection signal DET, generated from the detection signal generating section 13, to the internal voltage generating section 20.

The internal voltage generating section 20 is driven by an active signal ACT, that is, an externally applied driving signal. When the detection signal DET of a high state is applied from the high voltage detecting section 10, the internal voltage generating section 20 produces an internal voltage Vint1 of a desired high voltage level for a burn-in mode to a word line W/L, otherwise it generates an internal voltage Vint2 lower than the external voltage Vext to the word line.

Figure 4:
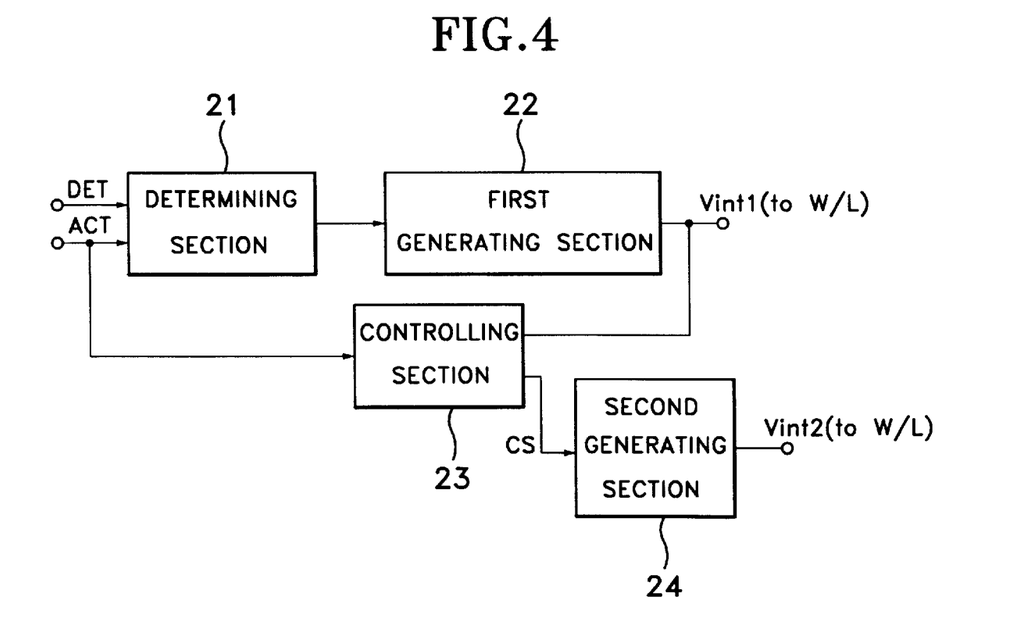
FIG. 4 is a block diagram of an internal voltage generating section shown in FIG. 1.

As shown in FIG. 4, the internal voltage generating section 20 includes a determining section 21 for determining whether the high voltage is detected from the detection signal of the high voltage detection signal and a first generating section 22 for generating the internal voltage Vint1 for a burn-in mode of a desired high voltage level higher than the external voltage Vext according a determining signal outputted from the determining section 21.

The internal voltage generating section 20 includes a controlling section 23 for generating a control signal CS and a second generating section 24 for generating the internal voltage Vint2 lower than the external voltage according to the control signal CS from the controlling section 23.

Figure 5:
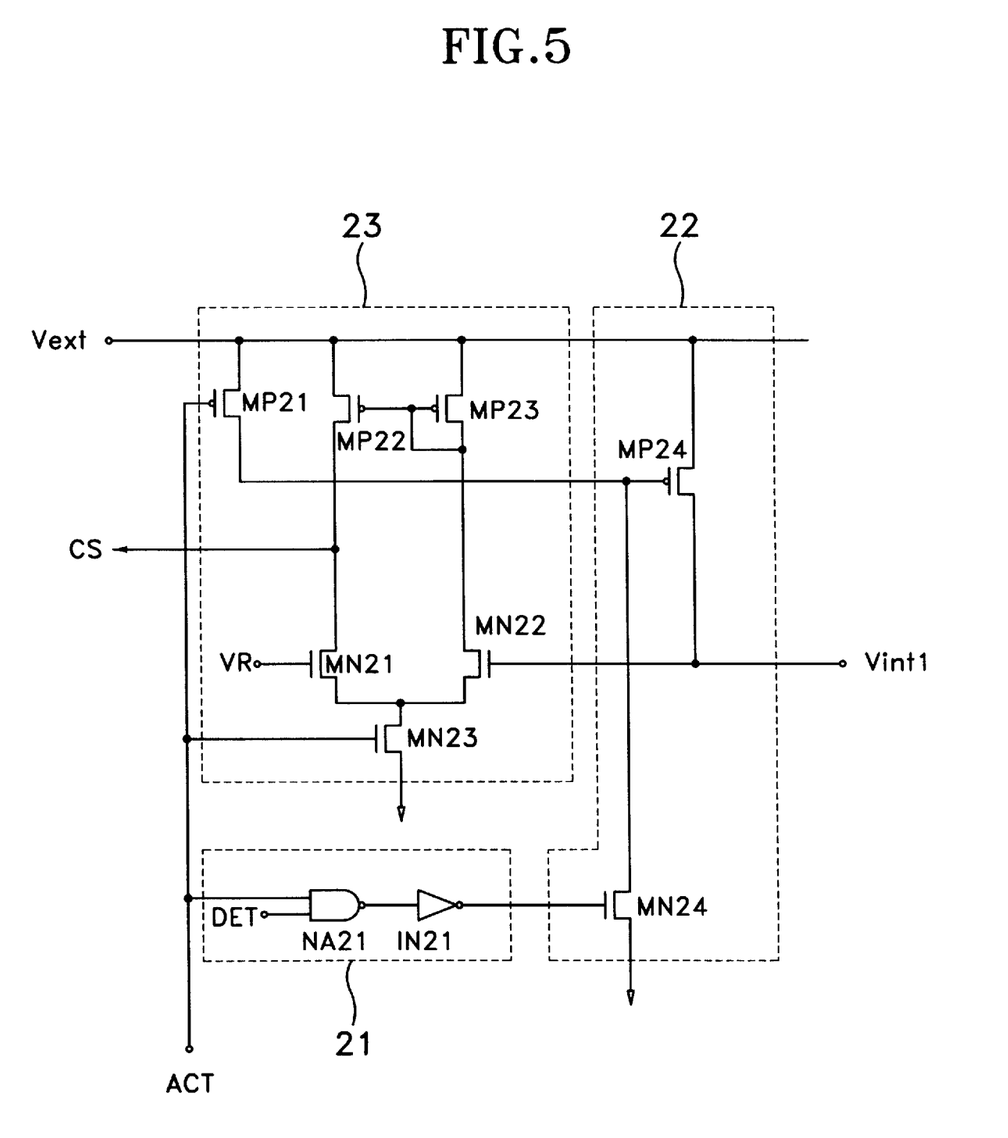
FIG. 5 is a detail circuit diagram of the internal voltage generating section shown in FIG. 4.

Referring to FIG. 5, the determining sections 21 comprises a NAND gate NA21 receiving the active signal ACT externally applied and the detection signal DET from the high voltage detecting section 10, and an inverter IN21 for inverting the output of the NAND gate NA21 and providing the inverted output signal of the NAND gate NA21 to the first generating section 22 as the determining signal.

The first generating section 22 comprises an NMOS transistor MN24 which the output of the inverter IN21 in the determining sections 21 is applied to its gate, and its source is grounded, and a PMOS transistor MP24 which a drain of the NMOS transistor MN24 is connected to its gate, the external voltage Vext is applied to its source and generates the internal voltage Vint1 for a burn-in mode through its drain.

The controlling section 23 is driven by the external driving signal ACT and produces the control signal CS for controlling the second generating section 24 to generate the internal voltage Vint2 lower than the external voltage Vext when the first generating section 21 is disabled by the determining signal from the determining section 21.

The controlling section 23 comprises a PMOS transistor MP21 which the external driving signal ACT is applied to its gate, the external voltage Vext is applied to its source and its drain is connected to the gate of the PMOS transistor MP24 in the first generating section 22, PMOS transistors MP22 and MP23, serving as a current mirror, which the external voltage Vext is applied to their sources and their gates are commonly connected to a drain of the PMOS transistor MP23, an NMOS transistor MN21 which a drain of the PMOS transistor MP22 is connected to its drain and the reference voltage VR is applied to its gate, an NMOS transistor MN22 which the drain of the PMOS transistor MP23 is connected to its drain and an internal voltage Vint1 from the first generating mean is applied to its gate, and an NMOS transistor MN23, serving as a current source, which its drain is commonly connected to the sources of the NMOS transistors MN21 and MN22, its source is grounded and the active signal ACT as an external driving signal is applied to its gate.

The second generating section 24 has a same construction as the conventional internal voltage generating circuit that receives the external voltage Vext and generates the internal voltage Vint2 lower than the external voltage.

The operation of the internal voltage generating circuit in a semiconductor memory device as constructed above will be described with reference to the waveform diagram in FIG. 7.

With an external voltage Vext applied, the voltage dividing section 11 voltage-divides the external voltage Vext by using the PMOS transistors MP11–MP13 and NMOS transistor MN11, functioning as voltage dividers. Thus at the node A, the divided voltage is sustained.

The PMOS transistors MP11–MP13 and NMOS transistor MN11, functioning as a voltage divider, are regulated for their sizes so as to apply the divided voltage more than 3.3 volts to the node A, when a high voltage of above 7 volts is applied to the voltage dividing section 11 as the external voltage Vext for a burn-in mode.

If a high voltage above 7 volts for a burn-in mode is applied as the external voltage Vext, the divided voltage more than 3.3 volts is applied to the node A. The divided voltage above 3.3 V at the node A is applied to the gate of the NMOS transistor MN12 of the comparing section 12. Accordingly, a relatively low voltage at the node B is applied to the detection signal generating means 13, turning on the PMOS transistor MP16, and the detection signal generating section 13 produces through a node C the detection signal of a high state which indicates that a high voltage for a burn-in mode is applied as the external voltage Vext.

The detection signal of a high state at the node C in the detection signal generating section 13 is applied through the buffer 14 to the internal voltage generating section 20 as the high voltage detection signal DET.

The detection signal DET of a high state from the high voltage detecting section 10 is provided to the determining section 21 of the internal voltage generating section 20. The NAND gate NA21 inputs the detection signal DET and the driving signal ACT to generates a high state output signal as a determining signal indicating that the external voltage Vext is detected as the high voltage in a burn-in mode.

The output signal of the NAND gate NA21 is applied to the gate of the NMOS transistor MN24 via the inverter IN21, thereby being turned on, and the PMOS transistor MP24 of the second generating section 22 is turned on. Thus the high voltage higher than the external voltage Vext is supplied to the word line W/L of the internal circuit as an internal voltage Vint1. That means, as shown in FIG. 7, the internal voltage generating circuit of the present invention generates a high voltage of 8 volts as an internal voltage Vint1 when a high voltage above 7 volts for a burn-in test is applied as the external voltage Vext.

At this time, the controlling section 23 generates the control signal of a high state to the second generating section 24 and the second generating section 24 is disabled by the control signal CS of a high state.

With the external voltage Vext below 7 volts, the divided voltage less than 3.3 volts is applied to the node A through the voltage dividing section 11 of the high voltage detecting section 10. The divided voltage of a relatively low voltage level is applied to the gate of the NMOS transistor MN12. The node B of the comparing section 20 becomes at a relatively high voltage and the PMOS transistor MP16 is turned off.

The node C of the detection signal generating section 13 is at a low state and the buffer 14 provides the detection signal DET of a low state to the internal voltage generating section 20.

When the detection signal DET of a low state from the high voltage detecting section 10 is applied to the internal voltage generating section 20, the NAND gate NA21 outputs a high state signal as a determining signal indicating that the external voltage Vext is not detected as a high voltage for a burn-in mode. The NMOS transistor MN24 is turned off and the PMOS transistor MP24 is also turned off. Accordingly, the second generating section 23 does not operate.

At this time, the controlling section 23 generates the control signal CS of a low state to the second generating section 24 as the first generating section 22 is disabled. The second generating section 24 is enabled by the control signal CS of a low state and generates the internal voltage Vint2 lower than the external voltage.

Figure 7:
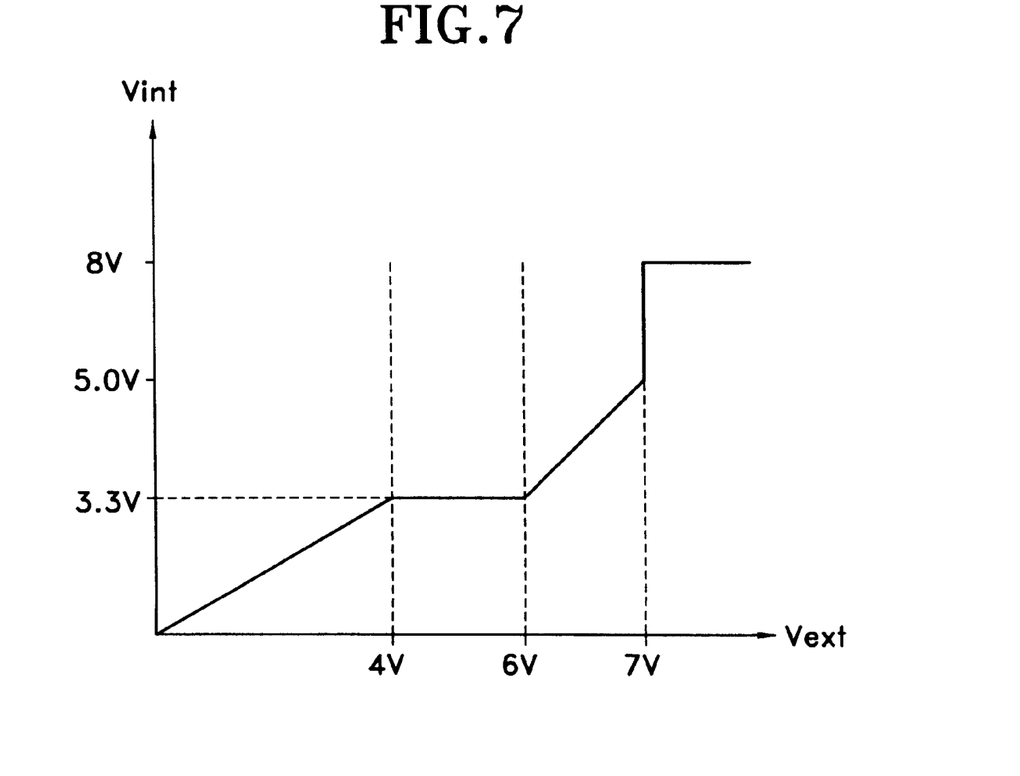
FIG. 7 is an output waveform diagram of an internal voltage generating circuit in a semiconductor memory device according to the preferred embodiment of the present invention.

As shown in FIG. 7, with an external voltage Vext below 7 volts applied, the second generating section 24 in the internal voltage generating section 20 generates the internal voltage Vint2 is lower than the external voltage Vext through the second generating section 24.

As described above, the internal voltage generating circuit in a semiconductor memory device of the present invention produces an internal voltage of a high voltage level, i.e., 8 volts higher than a external voltage, when a high external voltage of above a predetermined voltage level in a burn-in mode is applied to, otherwise it generates an internal voltage lower than the external voltage. Thus, the present invention increases the stress of the word line in a burn-in mode and enhances the word line driving efficiency.

It will be apparent to those skilled in the art that various modifications and variations can be made in the internal voltage generator circuit in a semiconductor memory device according to the present invention without departing from the spirit or scope of the invention. Thus, it is intended that the present invention cover the modifications and variations of this invention provided they come within the scope of the appended claims and their equivalents.

What is claimed is:

1. An internal voltage generating circuit in a semiconductor memory device, comprising:

high voltage detecting means for receiving an external voltage, detecting whether the external voltage is at a high voltage in a burn-in mode, and generating a detection signal; and internal voltage generating means driven by a driving signal externally applied, for generating an internal voltage for a burn-in mode of a desired high voltage level higher than the external voltage or an internal voltage lower than the external voltage in response to the detection signal received from the high voltage detecting means;

wherein the high voltage detecting means comprises:
voltage dividing means for voltage-dividing the external voltage;
comparing means for comparing the divided voltage of the voltage dividing means to a reference voltage; and
detection signal generating means for generating the detection signal according to an output signal from the comparing means.

2. The internal voltage generating circuit as defined in claim 1, wherein the voltage dividing means of the high voltage detecting means comprises:
a first NMOS transistor which the reference voltage is applied to its gate, and its source is grounded; and
first to third PMOS transistors which is connected between the external voltage and a drain of the first NMOS transistor and their gates are commonly connected to the drain of the first NMOS transistor,
wherein the divided voltage from the voltage dividing means is generated through the drains of the third PMOS transistor and the first NMOS transistor commonly connected each other.

3. The internal voltage generating circuit as defined in claim 1, wherein the comparing means of the high voltage detecting means comprises:
fourth and fifth PMOS transistors, functioning as a current mirror, which the external voltage is applied to their sources and their gates are commonly connected to a drain of the fifth PMOS transistor;
a second NMOS transistor which the divided voltage of the voltage dividing means is applied to its gate, and a drain of the fourth PMOS transistor is connected to its drain;
a third NMOS transistor which the reference voltage is applied to its gate, and the drain of the fifth PMOS transistor is connected to its drain; and
a fourth NMOS transistor which the reference voltage is applied to its gate, its source is grounded and its drain is connected to sources of the second and third NMOS transistors,
wherein the output signal of the comparing means is generated through the drains of the fourth PMOS transistor and second NMOS transistor commonly connected each other.

4. The internal voltage generating circuit as defined in claim 1, wherein the detection signal generating means of the high voltage detecting means comprises:
a sixth PMOS transistor which the external voltage is applied to its source, and the output signal from the comparing means is applied to its gate; and
a fifth NMOS transistor which a drain of the sixth PMOS transistor is connected to its drain, its source is grounded, and the reference voltage is applied to its gate,
wherein the detecting signal from the detection signal generating means is generated through the drains of the sixth PMOS transistor and fifth NMOS transistor commonly each other.

5. The internal voltage generating circuit as defined in claim 1, wherein the high voltage detecting means further comprises buffer means for applying the detection signal of the detection signal generating means to the internal voltage generating means.

6. The internal voltage generating circuit as defined in claim 5, wherein the buffer means of the high voltage detecting means comprises a plurality of inverters for applying the detecting signal from the detection signal generating means to the internal voltage generating means.

7. An internal voltage generating circuit in a semiconductor memory device, comprising:
high voltage detecting means for receiving an external voltage, detecting whether the external voltage is at a high voltage in a burn-in mode, and generating a detection signal; and
internal voltage generating means driven by a driving signal externally applied, for generating an internal voltage for a burn-in mode of a desired high voltage level higher than the external voltage or an internal voltage lower than the external voltage in response to the detection signal received from the high voltage detecting means wherein the internal voltage generating means comprises:
determining means in response to the driving signal, for determining whether high voltage is detected according to the detection signal from the high voltage detection means and for generating a determining signal;
first generating means for generating the internal voltage for a burn-in mode of a desired high voltage level higher than the external voltage in accordance with the determining signal from the determining means;
second generating means for generating the internal voltage lower than the external voltage in accordance with a control signal; and
controlling means in response to the driving signal, for generating the control signal for controlling the second generating means.

8. The internal voltage generating circuit as defined in claim 7, wherein the determining means of the internal voltage generating means includes:
a NAND gate for receiving the driving signal and the detection signal from the high voltage detecting section; and
an inverter for inverting an output signal of the NAND gate and providing the inverted output signal of the NAND gate as the determining signal to the first generating means.

9. The internal voltage generating circuit as defined in claim 7, wherein the determining means of the internal voltage generating means includes:
a NAND gate for receiving the driving signal and the detection signal from the high voltage detecting section; and
an inverter for inverting an output signal of the NAND gate and providing the inverted output signal of the NAND gate as the determining signal to the first generating means,
wherein when the high voltage is detected, the determining means outputs the determining signal of a high state so as to be generated the internal voltage for a burn-in mode through the first generating means.

10. The internal voltage generating circuit as defined in claim 7, wherein the first generating means of the internal voltage generating means comprises:
a first NMOS transistor which the determining signal from the determining means is applied to its gate, its source is grounded; and
a first PMOS transistor which the external voltage is applied to its source, its gate is connected to a drain of the first NMOS transistor and generates the internal voltage for a burn-in mode through its drain.

11. The internal voltage generating circuit as defined in claim 7, wherein the controlling means of the internal voltage generating means comprises:
- a second PMOS transistor which the driving signal is applied to its gate, the external voltage is applied to its source, and the first generating means is connected to its drain;
- third and fourth PMOS transistors, serving as a current mirror, which the external voltage is applied to their source, and their gates are commonly connected to a drain of the fourth PMOS transistor;
- a second NMOS transistor which a drain of the third PMOS transistor is connected to its drain, and the reference voltage is applied to its gate;
- a third NMOS transistor which the drain of the fourth PMOS transistor is connected to its drain, and the internal voltage from the first generating means is applied to its gate; and
- a fourth NMOS transistor which sources of the second and third NMOS transistors are connected to its drain, the driving signal is applied to its gate and its source is grounded,
- wherein the control signal from the controlling means is generated through the drains of the third PMOS transistor and the second NMOS transistor commonly connected each other.

12. The internal voltage generating circuit as defined in claim 7, wherein the controlling means of the internal voltage generating means comprises:
- a second PMOS transistor which the driving signal is applied to its gate and the external voltage is applied to its source, and the first generating means is connected to its drain;
- third and fourth PMOS transistors, serving as a current mirror, which the external voltage is applied to their source, and their gates are commonly connected to a drain of the fourth PMOS transistor;
- a second NMOS transistor which a drain of the third PMOS transistor is connected to its drain, and the reference voltage is applied to its gate;
- a third NMOS transistor which the drain of the fourth PMOS transistor is connected to its drain, and the internal voltage from the first generating means is applied to its gate; and
- a fourth NMOS transistor which sources of the second and third NMOS transistors are connected to its drain, the driving signal is applied to its gate and its source is grounded,
- wherein when the internal voltage for a burn-in mode is generated from the first generating means, the control means generates the control signal of a high state to the second generating means through the drains of the third PMOS transistor and the second NMOS transistor commonly connected each other and thereby disabling the second generating means, otherwise it generates the control signal of a low state to the second generating means and thereby enabling the second generating means to generate the internal voltage lower than the external voltage.

13. An internal voltage generating circuit in a semiconductor memory device, comprising:
- high voltage detecting means for receiving an external voltage, detecting whether the external voltage is at a high voltage in a burn-in mode, and generating a detection signal, wherein the high voltage detecting means generates the detection signal of a high state by determining as the burn-in mode when the external voltage is about 7 volts; and
- internal voltage generating means driven by a driving signal externally applied, for generating an internal voltage for a burn-in mode of a desired high voltage level higher than the external voltage or an internal voltage lower than the external voltage in response to the detection signal received from the high voltage detecting means.

14. An internal voltage generating circuit in a semiconductor memory device, comprising:
- high voltage detecting means for receiving an external voltage, detecting whether the external voltage is at a high voltage in a burn-in mode, and generating a detection signal; and
- internal voltage generating means driven by a driving signal externally applied, for generating an internal voltage for a burn-in mode of a desired high voltage level higher than the external voltage or an internal voltage lower than the external voltage in response to the detection signal received from the high voltage detecting means wherein the internal voltage generating means produces the internal voltage of 8 volts when the external voltage is at a high voltage for a burn-in mode.

15. An internal voltage generating circuit in a semiconductor memory device, comprising:
- high voltage detecting means for detecting whether an external voltage is at a high voltage in a burn-in mode and generating a detection signal; and
- internal voltage generating means including determining means in response to the driving signal, for determining whether high voltage is detected according to the detection signal from the high voltage detection means and generating a determining signal; first generating means for generating the internal voltage for a burn-in mode of a desired high voltage level higher than the external voltage in accordance with the determining signal from the determining means; second generating means for generating the internal voltage lower than the external voltage in accordance with a control signal; and controlling means in response to the driving signal, for generating the control signal for controlling the second generating means,
- wherein when the high voltage detection means detects the high voltage, the determining means of the internal voltage generating means generates the determining signal of a high state and the first generating means of the internal voltage generating means is enabled according to the determining signal of a high state, and thereby generating the internal voltage for a burn-in mode higher than the external voltage, otherwise the controlling means generates the control signal of a low state and the second generating means is enabled, thereby generating the internal voltage lower than the external voltage.

16. An internal voltage generator circuit in a semiconductor memory device, comprising:
- high voltage detecting means for receiving an external voltage, and including a voltage dividing means for voltage-dividing the external voltage, and including a comparing means for comparing the divided voltage of the voltage dividing means to a reference voltage, said high voltage detecting means for detecting whether the external voltage is at a high voltage in a burn-in mode, and including a detection signal generating means for generating a detection signal according to the result of the comparison from the comparing means; and internal voltage generating means driven by a driving signal externally applied, for determining whether the high voltage is detected from the high voltage detection means, and generating an internal voltage for a burn-in mode higher than the external voltage or an internal voltage lower than the external voltage in accordance with the determining result.

17. An internal voltage generator circuit in a semiconductor memory device, comprising:

high voltage detecting means for dividing an external voltage, comparing the divided voltage to a reference voltage, and generating a detection signal according to the result of the comparison; and internal voltage generating means driven by a driving signal externally applied, for determining whether the high voltage is detected from the high voltage detection means, and generating an internal voltage for a burn-in mode higher than the external voltage or an internal voltage lower than the external voltage in accordance with the determining result, wherein the internal voltage generating means includes:

determining means in response to the driving signal, for determining whether high voltage is detected according to the detection signal from the high voltage detecting means and for generating a determining signal;

first generating means for generating the internal voltage for a burn-in mode of a desired high voltage level higher than the external voltage in accordance with the determining signal from the determining means;

second generating means for generating the internal voltage lower than the external voltage in accordance with a control signal; and controlling means in response to the driving signal, for generating the control signal for controlling the second generating means.

18. An internal voltage generator circuit in a semiconductor memory device, comprising:

high voltage detecting means for dividing an external voltage, comparing the divided voltage to a reference voltage, and generating a detection signal according to the result of the comparison, and wherein the high voltage detecting means generates the detection signal of a high state by determining as the burn-in mode when the external voltage is about 7 volts; and internal voltage generating means driven by a driving signal externally applied, for determining whether the high voltage is detected from the high voltage detection means, and generating an internal voltage for a burn-in mode higher than the external voltage or an internal voltage lower than the external voltage in accordance with the determining result.

19. An internal voltage generator circuit in a semiconductor memory device, comprising:

high voltage detecting means for dividing an external voltage, comparing the divided voltage to a reference voltage, and generating a detection signal according to the result of the comparison; and internal voltage generating means driven by a driving signal externally applied, for determining whether the high voltage is detected from the high voltage detection means, and generating an internal voltage for a burn-in mode higher than the external voltage or an internal voltage lower than the external voltage in accordance with the determining result, wherein the internal voltage generating means produces the internal voltage of 8 volts when the external voltage is at a high voltage for a burn-in mode.

* * * * *